US008501536B2

(12) United States Patent
Mooney et al.

(10) Patent No.: US 8,501,536 B2
(45) Date of Patent: Aug. 6, 2013

(54) INTEGRATING AND ALIGNING LASER CHIPS ON SLIDERS FOR HAMR APPLICATIONS

(75) Inventors: Marcus B. Mooney, Donegal (IE); Mark Anthony Gubbins, Donegal (IE); Bredan Lafferty, Eden Prairie, MN (US); Alin Mihai Fecioru, Londonderry (IE)

(73) Assignee: Seagate Technology LLC, Cupertino, CA (US)

( * ) Notice: Subject to any disclaimer, the term of this patent is extended or adjusted under 35 U.S.C. 154(b) by 500 days.

(21) Appl. No.: 12/751,452

(22) Filed: Mar. 31, 2010

(65) Prior Publication Data
US 2011/0243176 A1 Oct. 6, 2011

(51) Int. Cl.
H01L 21/00 (2006.01)
H01L 21/30 (2006.01)
H01L 21/46 (2006.01)
H01L 21/50 (2006.01)
H01L 21/58 (2006.01)

(52) U.S. Cl.
USPC .............. 438/107; 438/455; 257/E21.499; 257/E21.505

(58) Field of Classification Search
USPC .............. 438/26, 28, 107–118, 458–465; 257/E21.499, E21.505
See application file for complete search history.

(56) References Cited

U.S. PATENT DOCUMENTS

| | | | |
|---|---|---|---|
| 6,963,119 B2 * | 11/2005 | Colgan et al. | 257/432 |
| 7,521,292 B2 | 4/2009 | Rogers et al. | |
| 7,622,367 B1 | 11/2009 | Nuzzo et al. | |
| 7,732,301 B1 * | 6/2010 | Pinnington et al. | 438/455 |
| 2004/0048447 A1 * | 3/2004 | Kondo | 438/458 |
| 2004/0126928 A1 * | 7/2004 | Kinsman et al. | 438/108 |
| 2005/0238967 A1 | 10/2005 | Rogers et al. | |
| 2007/0032089 A1 | 2/2007 | Nuzzo et al. | |
| 2007/0109686 A1 * | 5/2007 | Jose et al. | 360/235.1 |
| 2009/0217517 A1 * | 9/2009 | Pique et al. | 29/832 |
| 2011/0058273 A1 * | 3/2011 | Sasaki et al. | 360/59 |

OTHER PUBLICATIONS

Menard, E. et al., "A printable form of silicon for high performance thin film transistors on plastic substrates." Applied Physics Letters. vol. 84, No. 26. 2004 American Institute of Physics. pp. 5398-5400.
"Printing unites III-Vs and silicon." Technology Processing. Institute of Physics Publishing and IOP Publishing. Adapted from Jun. 2007 issue of Compound Semiconductor. Retrieved Jan. 25, 2010 from <www.semprius.com/pdf/white_papers/white_paper_1.pdf>.

* cited by examiner

Primary Examiner — Charles Garber
Assistant Examiner — Calvin Choi
(74) Attorney, Agent, or Firm — Hollingsworth Davis, LLC (57) ABSTRACT

A method of producing a slider wafer populated with electromagnetic components optically aligned with photonic elements for HAMR applications. Laser chips are transferred from a laser substrate wafer to the slider wafer by a massively parallel printing transfer process. After wafer bonding the laser chips to the slider wafer, the shape and optical alignment of the photonic elements are precisely aligned en masse by lithographic processing.

19 Claims, 11 Drawing Sheets

INTEGRATING AND ALIGNING LASER CHIPS ON SLIDERS FOR HAMR APPLICATIONS

BACKGROUND

Heat assisted magnetic recording (HAMR) generally refers to the concept of locally heating a recording medium with a laser to reduce the coercivity. This allows the applied magnetic writing fields to more easily direct the magnetization during the temporary magnetic softening caused by the heat source. HAMR allows for the use of small grain media, with a larger magnetic anisotropy at room temperature to assure sufficient thermal stability, which is desirable for recording at increased areal densities. HAMR can be applied to any type of magnetic storage media including tilted media, longitudinal media, perpendicular media, and patterned media. By heating the media, the $K_u$ or coercivity is reduced such that the magnetic write field is sufficient to write to the media. Once the media cools to ambient temperature, the coercivity has a sufficiently high value to assure thermal stability of the recorded information.

Close proximity of the heat source and magnetic write pole is essential for successful HAMR. A number of techniques have been proposed to deliver electromagnetic energy to the NFT. In some, the source is remote to the slider containing the recording head and directs energy to the NFT via waveguides mounted on the slider. Another uses optical fibers to deliver energy to the slider from remotely mounted lasers. Optical fibers are stiff and affect the slideability of the slider in a disc drive system. Micro electromechanical (MEM) mirrors have also been suggested for energy delivery. Recent solutions have suggested mounting the laser directly on the slider thereby eliminating peripheral, optical, and other system components. Mounting the laser on the slider simplifies the energy delivery system for HAMR but the process of individually aligning each laser results in high production costs and low alignment accuracy. There is a need for a compact, modular HAMR recording device that can provide localized heating without costly components and alignments.

SUMMARY

An efficient method of fabricating a slider wafer populated with precisely shaped and aligned photonic elements for HAMR application is disclosed. The method includes first producing a slider wafer populated with electrical and magnetic components necessary for HAMR application. Laser chips and associated photonic components from a separate laser wafer are then transferred to the slider wafer using a printing transfer process. After the laser chips and associated photonic components are wafer bonded, their shape and optical alignment with respect to other photonic and magnetic circuitry on the wafer are precisely and accurately defined by lithographic processing.

An apparatus containing magnetic and photonic elements for HAMR recording is formed by first populating a slider wafer with electrical and magnetic components. Photonic elements such as laser chips are then transferred en masse from a laser wafer to the slider wafer by a printing transfer process. The photonic elements are then shaped and aligned with the magnetic elements by lithographic processing before individual sliders are cut from the populated wafer.

DETAILED DESCRIPTION

HAMR relies on an energy source such as a laser to locally heat the surface of a storage medium. Lasers can be remote to the slider or directly mounted on the slider. Recent HAMR recording head slider configurations have designs with lasers mounted directly on the slider as part of the photonic energy delivery system. Lasers mounted on the slider at the chip level suffer the alignment inaccuracies inherent in pick and place microelectronic assembly equipment. Individually aligning lasers on each slider also results in high assembly costs. The present invention surmounts these obstacles by fabricating and aligning the lasers at the wafer level. The laser chips are economically placed by printing and then accurately aligned in massively parallel fashion by lithographic processing.

Figure 1:
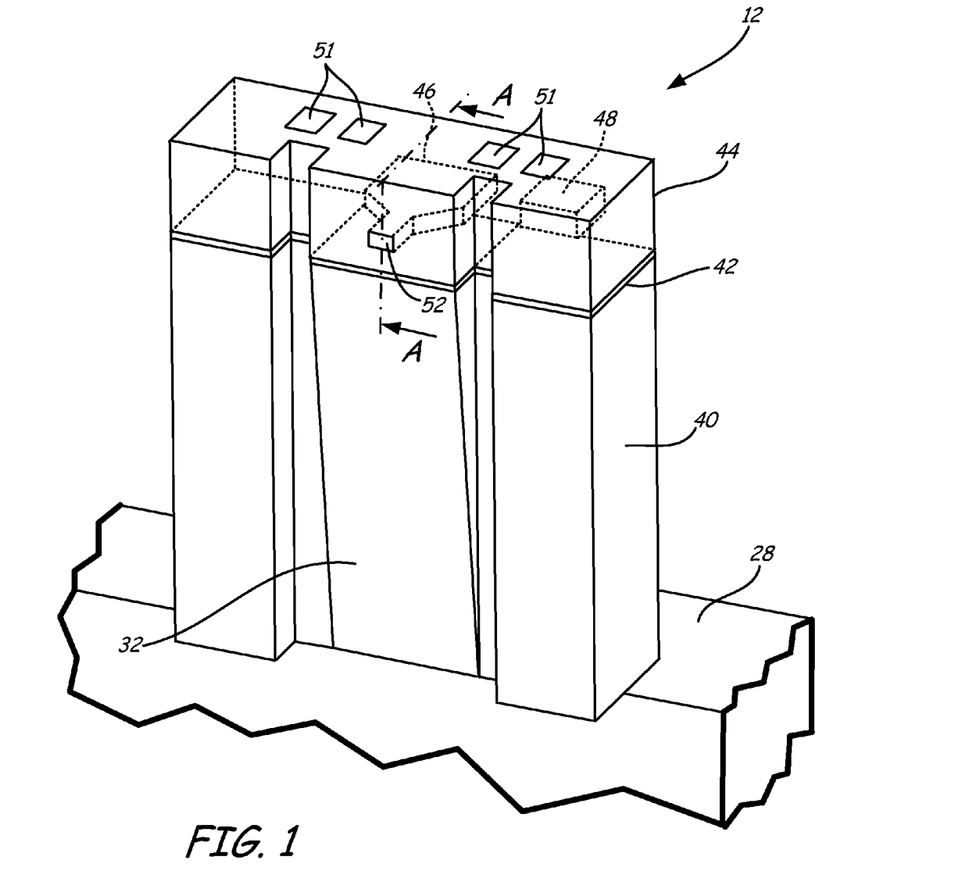
FIG. 1 is a schematic representation of a HAMR recording head slider.

FIG. 1 shows a schematic perspective view of recording head slider 12 attached to suspension 28. Slider 12 has a substantially rectangular form with a recording medium facing surface also referred to as an air bearing surface. When a hard disc rotates, slider 12 floats up because of an air flow due to the rotation whereby air bearing surface 32 separates from the disc surface. Slider 12 is one example of a slider configuration. Many others are known in the art.

Slider 12 comprises substrate 40, insulating layer 42, and multilayer thin film laminate 44. Multilayer laminate 44 contains magnetic HAMR transducer 46, electromagnetic energy source 48, external electrical contacts 51, and other microelectronic and associated photonic elements and circuitry (not shown). Transducer 46 and electromagnetic energy source 48, preferably a laser, are shown dotted implying they are embedded in layer 44. The remaining material in layer 44 is $Al_2O_3$ in some embodiments. HAMR transducer 46 intersects the air bearing surface at media facing surface interface 52. The perspective slider shape shown in FIG. 2 is shown for ease of describing the present invention and is not intended to limit the scope of the present invention in any way.

Slider materials of choice by the magnetic recording industry are sintered aluminum oxide/titanium carbide (AlTiC) composites containing other materials, as necessary, to control machinability, electrical properties, and other performance parameters.

Figure 2:
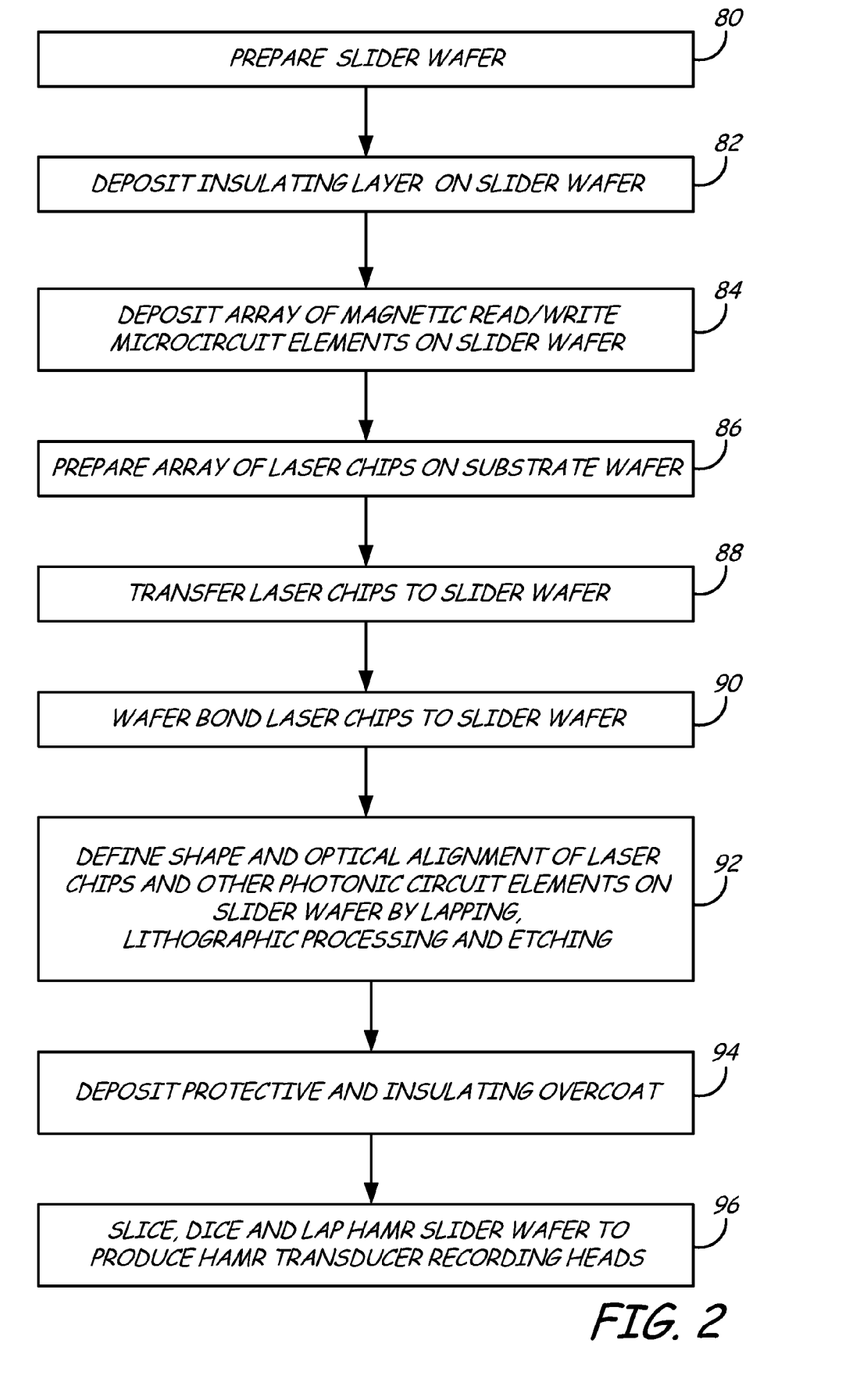
FIG. 2 is a diagram showing the steps in the manufacture of HAMR recording head sliders.
Figure 3A:
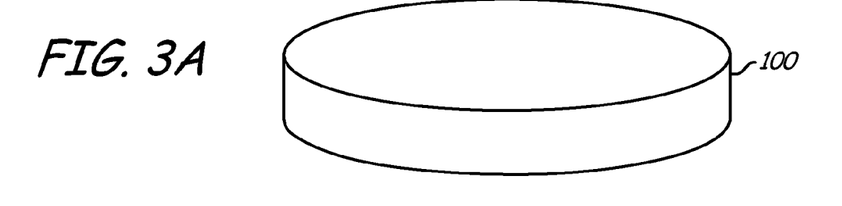
FIGS. 3A-3G are perspective views showing a slider wafer at various stages during the manufacture of HAMR recording sliders.
Figure 3B:
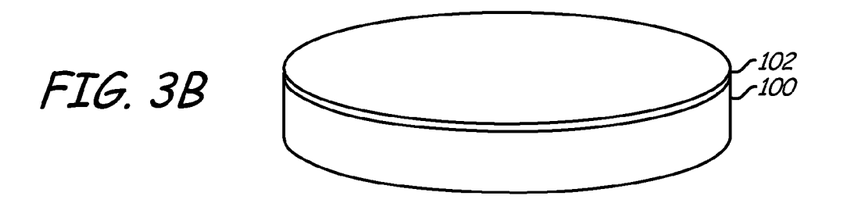
Figure 3C:
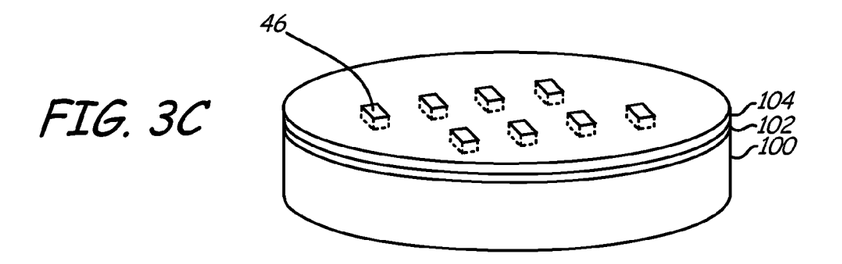

The process of fabricating a HAMR recording head is listed in FIG. 2 and schematically illustrated in FIGS. 3A-3G. The initial step in the process is the preparation of slider wafer 100 as shown in FIG. 3A (step 80). The next step is the deposition of insulating layer 102 on slider wafer 100 as shown in FIG. 3B (Step 82). Insulating layer 102 is preferably aluminum oxide and deposition methods are well known in the art.

Chip to Wafer Integration

The next step is to populate layer 102 with magnetic and photonic HAMR transducer elements schematically illustrated in FIG. 6C as rectangular HAMR transducer chips 46 comprising layer 104 (Step 84). Other magnetic, electrical and optical components, not shown, also comprise layer 104.

Methods of preparation of slider wafer 100 populated with magnetic HAMR transducer chips are known in the art and do not form an embodiment of the present invention. The present invention comprises a low cost method of populating a HAMR slider wafer with a high density of precisely aligned laser chips and other photonic circuitry at the wafer level without having to individually align each laser for optimal performance. The method relies on the benefits of massively parallel microelectronic fabrication offered by laser chip placement by printing, and subsequent shaping and alignment by lithographic processing.

Figure 4:
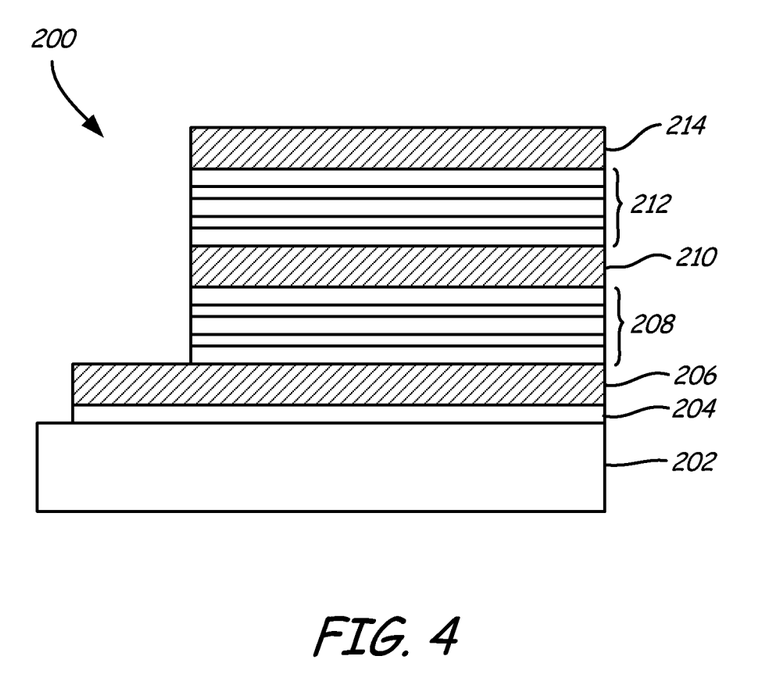
FIG. 4 is a schematic diagram of a semiconductor laser device.

The next step in the fabrication of a HAMR recording head, according to an embodiment of the present invention, is to fabricate laser chips as the energy source for HAMR (Step 86). Common energy sources are epitaxial multilayer III-V and II-VI compound semiconductor lasers. A schematic of a representative structure of multilayer compound semiconductor laser 200 is shown in FIG. 4. Laser 200 comprises substrate 202, wafer bond 204, bottom electrode 206, bottom reflector layer 208, active layer 210, top reflector layer 212, and top electrode 214.

In a semiconductor laser such as laser 200, active layer 210 emits light when current flows through it. Opposing reflecting layers 208 and 212 act to confine the laser energy between the layers. The reflecting layers are typically produced by depositing a sequence of layers of material having different indices of refraction. Such a structure is called a Distributed Bragg Reflector (DBR). The space between DBRs 208 and 212 (occupied by active layer 210) is called a Fabry-Perot cavity. In a semiconductor laser such as laser 200, it is common practice to dope the two reflecting structures in opposite fashion. That is, one of the reflecting layers 208 or 212 is doped n-type and the other 212 or 208 is doped p-type. Thus, the laser can have characteristics like those of a pn junction diode. A drive circuit causes the laser to produce light by applying a forward biased voltage between electrodes 206 and 214.

There are known ways of setting the refractive index of a layer of semiconductor material. For instance, if the layers are made of aluminum gallium arsenide (AlGaAs), the aluminum content can be varied. The higher the aluminum content, the lower the refractive index. The active layer in a laser with AlGaAs reflecting layers can be InAlGaAs. As mentioned, the layers may be doped to make them n-type or p-type. For instance, carbon (C) or magnesium (Mg) dopants can be used to make AlGaAs p-type.

Electrode layers can be configured to make laser 200 edge emitting by acting as reflectors. If top electrode 214 is configured to have an aperture, laser 200 can be a vertical cavity surface emitting laser (VCSEL).

Epitaxial multilayer III-V and II-VI semiconducting lasers are preferably formed by vapor phase methods commonly known in the art, such as metal organic chemical vapor phase deposition (MOCVD) and other methods using vapor deposition.

Figure 5:
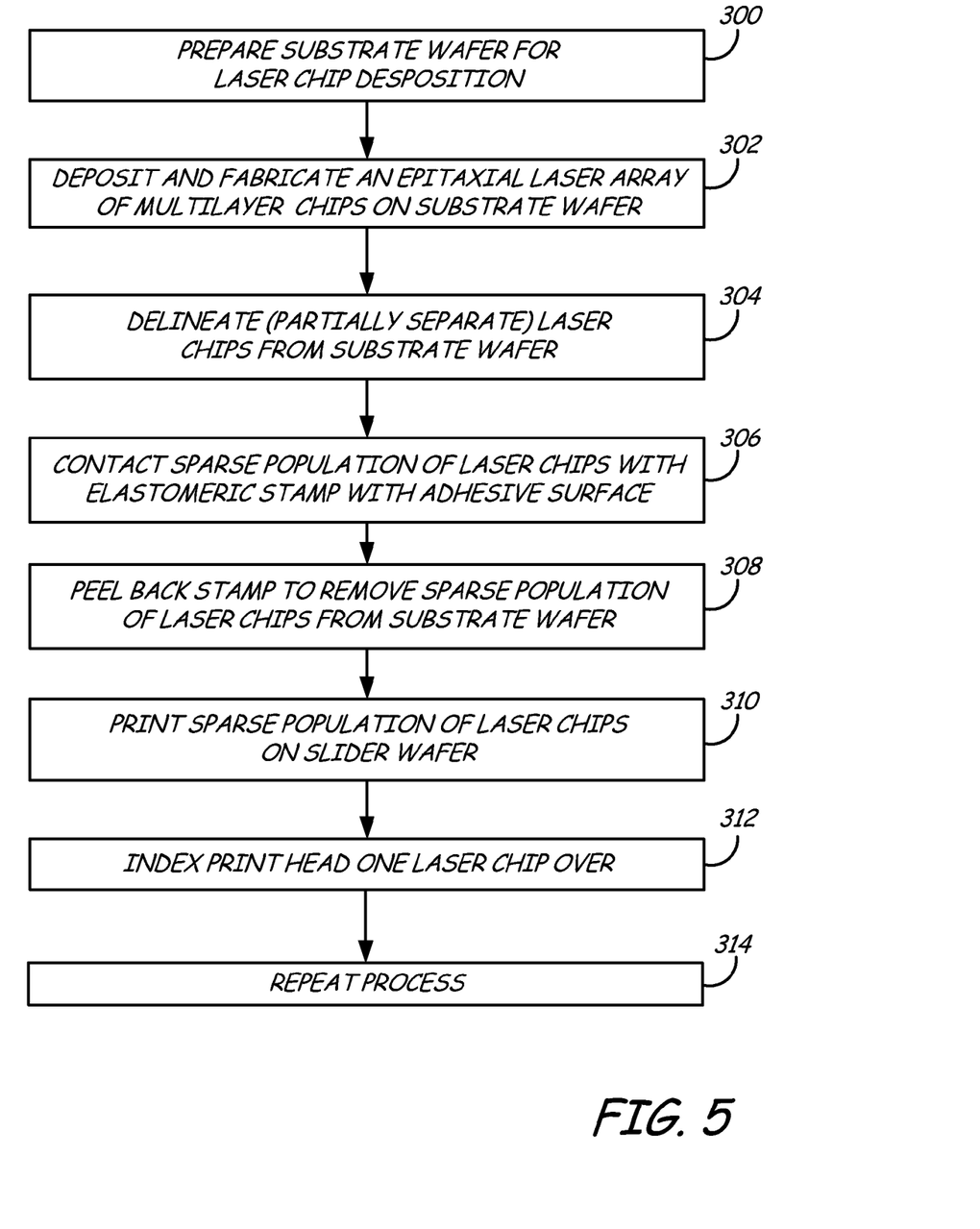
FIG. 5 is a diagram showing the steps in the process of populating a recording head slider wafer with laser chips.

A preferred embodiment of the present invention is given in FIG. 5 which lists the steps to fabricate epitaxial multilayer laser structures and transfer them to a slider wafer. The initial step is to prepare a substrate wafer for subsequent epitaxial layer deposition (Step 300). As an example, the substrate material of choice for GaAs-based laser structures is GaAs. The next step is to deposit and fabricate a dense array of multilayer laser chips on the substrate wafer by vapor phase deposition and lithographic patterning, etching, and other deposition processing procedures (Step 302). Typical dimensions of epitaxial multilayer HAMR laser chips are 300-350 µm long by 5-20 µm wide by 5-8 µm high.

The laser chips are then subjected to a delineation process that etches elongated cavities (streets) around each chip on the substrate wafer and undercuts the chips by removing a release layer by etching (Step 304). A preferred release layer for GaAs-based laser chips is AlAs. The delineated chips are then transferred from the substrate wafer to a slider wafer by printing.

The first step in the transfer process is to contact a sparse population of delineated laser chips on the substrate wafer with an elastomeric stamp pad (Step 306). The surface of the stamp pad contains discrete isolated regions coated with an adhesive. In the printing process, downward pressure applied to the stamp pad separates a sparse population of delineated chips from the substrate wafer by fracturing the mechanical connections remaining following delineation.

In the next step, the elastomeric stamp pad carrying the sparse population of laser chips is peeled back from the substrate wafer thereby separating the chips from the wafer (Step 308).

The elastomeric stamp pad is then positioned over a slider wafer for the transfer process. The slider wafer is covered with an adhesive thin film to capture the laser chips during printing. During printing, the elastomeric stamp pad moves to contact the slider wafer.

After contact, downward pressure on the stamp pad prints the sparse population of laser chips to the slider wafer. Peeling the print pad back from the slider wafer successfully transfers the sparse population of laser chips to the slider wafer (Step 310). Following printing, the print head is repositioned over the substrate wafer and is mechanically indexed sideways over to the next, unseparated, laser chip and the transfer process is repeated (Step 314). The print transfer process described above is the process used to populate HAMR slider wafer 100 with laser chips shown in FIG. 3D. (Step 88, FIG. 2). Following printing, the laser chips are wafer bonded to the slider wafer (Step 90).

The print transfer process is highly efficient and can fully populate a 45K head wafer in under 40 minutes versus 10 hours using existing pick and place technology.

Figure 3D:
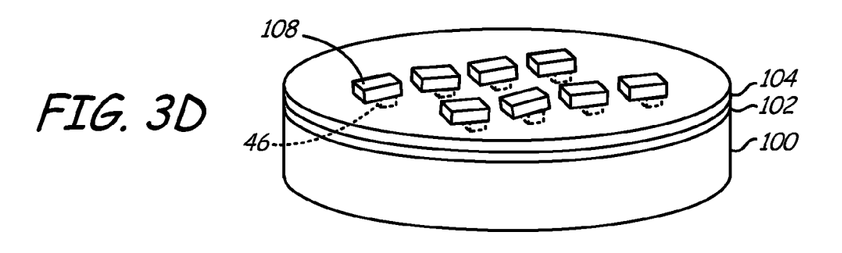

FIG. 3D schematically shows laser chips 108 printed and wafer bonded on HAMR slider wafer 100. An inherent feature of the printing process is that the chips are not perfectly aligned in a specific placement with respect to HAMR transducer chips 46. In a preferred embodiment of the present invention, the shape and optical alignment of the laser chips with respect to the HAMR transducer chips and other photonic and magnetic circuitry on the slider wafer can be rapidly and accurately defined and aligned by photolithographic processing (Step 92). This low cost, accurate, and massively parallel lithographic processing technology, in combination with rapid print placing of photonic components, are two major inventive embodiments of the present invention. In this step, the shape, and optical alignment of lasers and other photonic circuit elements are defined by photolithographic processing, etching, and lapping by procedures well known to those in the art. Submicron dimensional and alignment accuracy are achievable in this way in contrast to the lower alignment and placement accuracy of prior art pick and place technology.

Figure 3E:
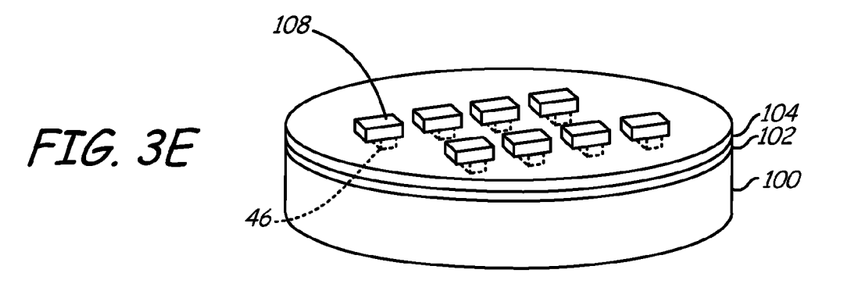
Figure 3F:
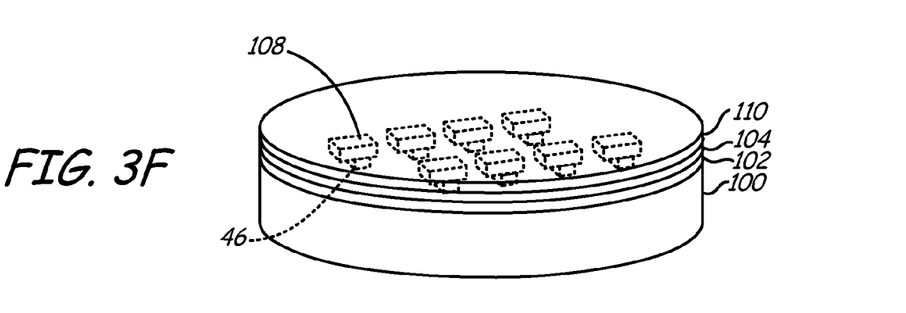
Figure 3G:
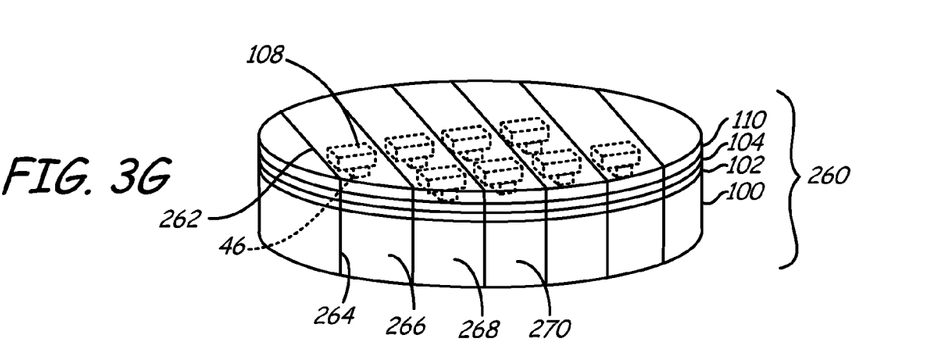

A schematic representation showing slider wafer 100 fully populated with shaped and optically aligned laser chips is shown in FIG. 3E. The next step in the process is to finish processing at the wafer level by depositing protective and insulative overcoats on the wafer as shown schematically in FIG. 3F by layer 110 (Step 94). The final step in the process to produce HAMR transducer recording heads is to slice, dice, and lap the finished HAMR transducer slider wafer into finished product (Step 96). The wafers are first sliced into bars. FIG. 3G shows finished HAMR slider wafer 260 sliced along lines 262 and 264 and others parallel to 262 and 264 to produce bars 266, 268, 270, etc.

Figure 6A:
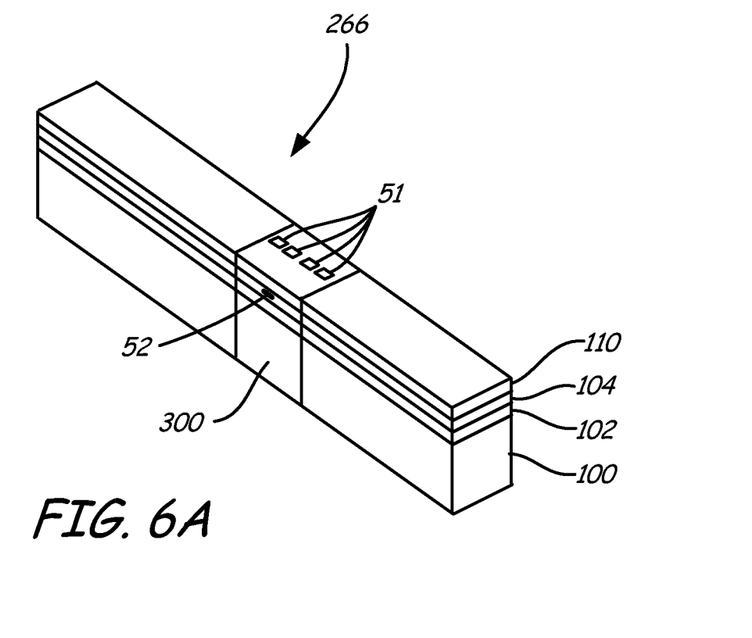
FIGS. 6A-6B show the process of cutting HAMR sliders from bars cut from HAMR wafers.
Figure 6B:
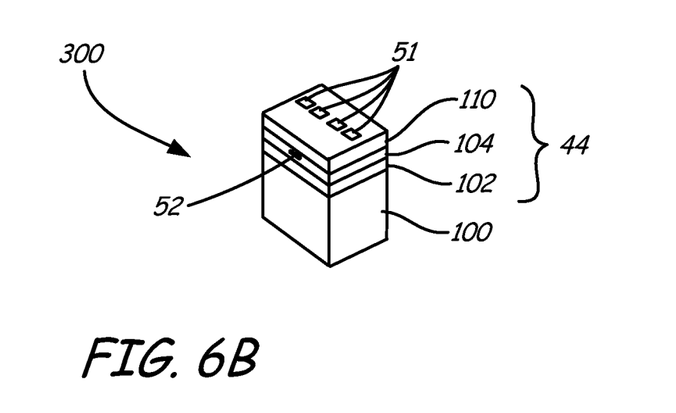

FIG. 6A shows a schematic of bar 266, for example, cut from slider wafer 260 in FIG. 6G. HAMR slider 300 cut from bar 266 in FIG. 6A is shown in FIG. 6B. Multilayer laminate 44, media facing interface 52 and electrical contacts 51 (FIG. 2) are shown on individual HAMR slider 300. The final step in fabrication of HAMR recording head slider 12 (FIG. 1) is shaping to form air bearing surfaces, etc.

In summary, the embodiments of the present invention comprise placing laser chips and other photonic elements by printing at the wafer scale during fabrication and shaping and optically aligning the printed elements by the massively parallel process of lithographic processing.

Wafer to Wafer Integration

Figure 7:
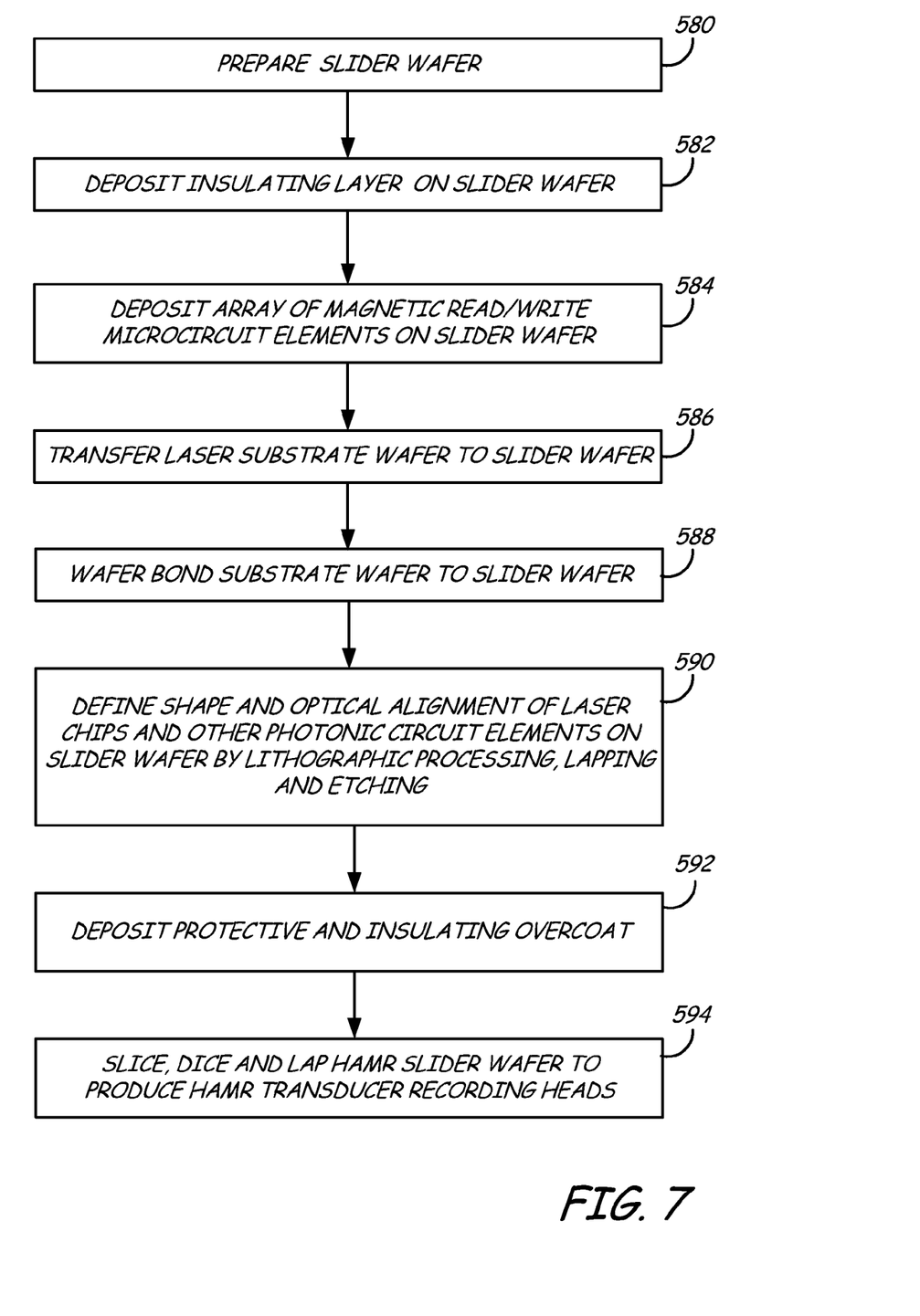
FIG. 7 is a diagram showing the process of producing HAMR recording heads after directly integrating laser substrate to slider wafer.
Figure 8A:
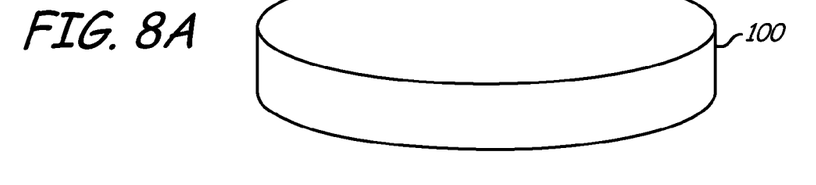
FIGS. 8A-8G are perspective views showing a slider wafer at various stages during the manufacture of HAMR recording slider by wafer to wafer integration.
Figure 8B:
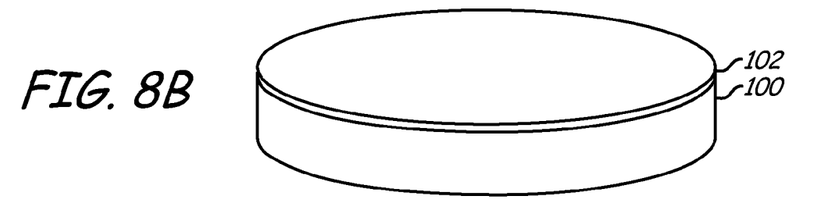

In another embodiment, the process of transferring laser chips and other components to a slider wafer by printing has been replaced by transferring a total wafer to the slider wafer wherein the components are fabricated in situ on the slider wafer by lithographic processing. The process of fabricating a HAMR recording head by wafer to wafer integration is listed in FIG. 7 and schematically illustrated in FIGS. 8A-8G. The initial step in the process is the preparation of slider wafer 100 as shown in FIG. 8A (Step 580). The next step is the deposition of insulating layer 102 on slider wafer 100 as shown in FIG. 8B (Step 582). Insulating layer 102 is preferably aluminum oxide and deposition methods are well known in the art.

Figure 8C:
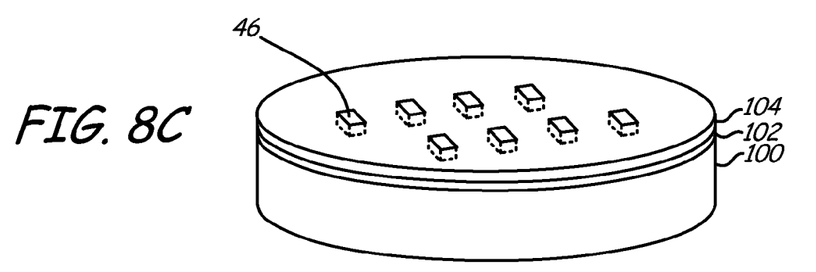

The next step is to populate layer 102 with magnetic and photonic HAMR transducer elements schematically illustrated in FIG. 8C as rectangular HAMR transducer chips 46 comprising layer 104 (Step 584). Other magnetic, electrical, and optical components not shown also comprise layer 104. The present invention comprises a low cost method of populating a HAMR slider wafer with a high density of precisely aligned laser chips and other photonic circuitry at the wafer level without having to individually align each laser for optimal performance. This embodiment relies on transferring a total laser chip wafer to the HAMR wafer and subsequently fabricating precise arrays of laser chips on the wafer by photolithographic processing.

Figure 8D:
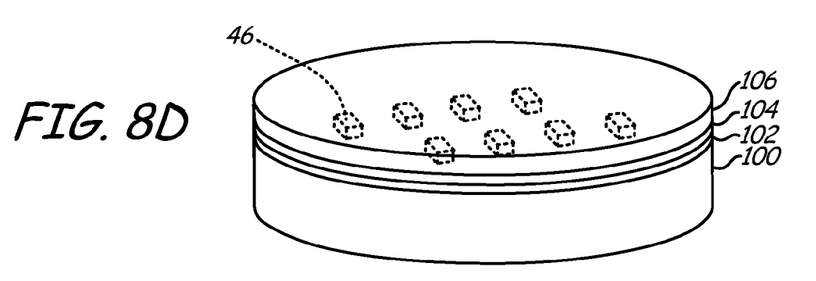
Figure 8E:
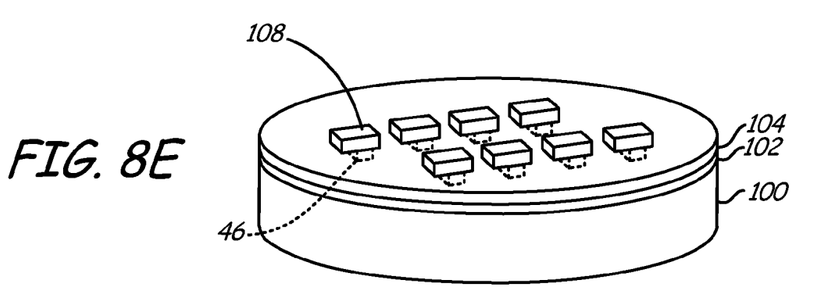

The next step in the fabrication of a HAMR recording head according to an embodiment of the present invention is to transfer laser substrate wafer 106 to layer 104 as shown in FIG. 8D (Step 586). The next step is to wafer bond laser substrate wafer 106 to layer 104. (Step 588). The next step is to define the shape and optical alignment of laser and other photonic circuit elements from layer 106 by lithographic processing, lapping, and etching (Step 590) as shown in FIG. 8E. FIG. 8E schematically shows laser chips 108 on layer 104 in a specific placement with respect to HAMR transducer chips 46. In this embodiment, the shape and optical alignment of the laser chips with respect to the HAMR transducer chips and other photonic and magnetic circuitry on the slider wafer are rapidly and accurately defined in situ by photolithographic processing. Submicron dimensional and alignment accuracy are achievable in this way in contrast to the lower alignment and placement accuracy of prior art pick and place technology.

Figure 8F:
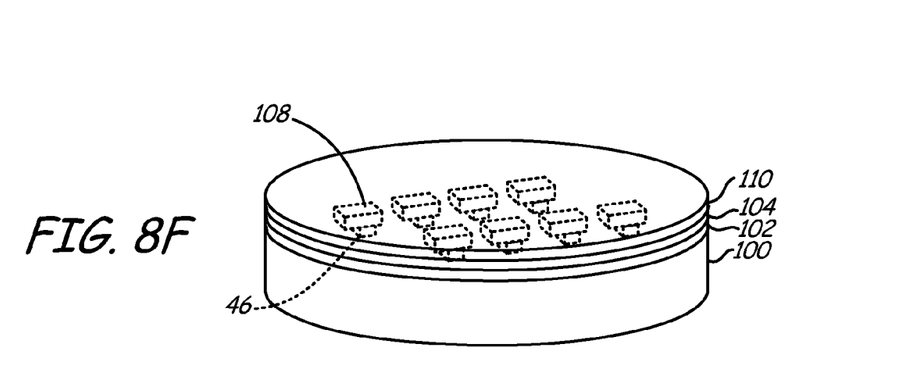
Figure 8G:
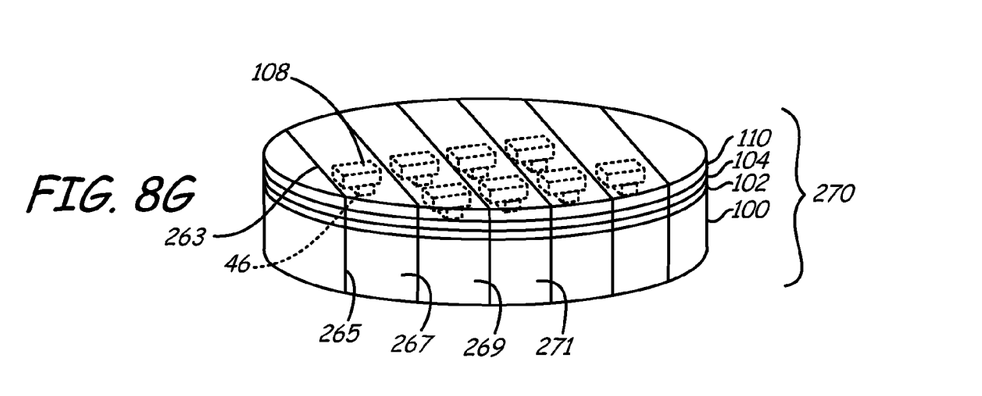

The next step in the process is to finish processing at the wafer level by depositing protective and insulative overcoats 110 on the wafer as shown schematically in FIG. 8F (Step 592). The final step is to dice finished HAMR slider wafer 270 into finished product (Step 594). The wafers are first sliced into bars. FIG. 8G shows finished HAMR slider wafer 270 sliced along lines 263 and 265 and others parallel to 263 and 265 to produce bars 267, 269, 271, etc.

Figure 9A:
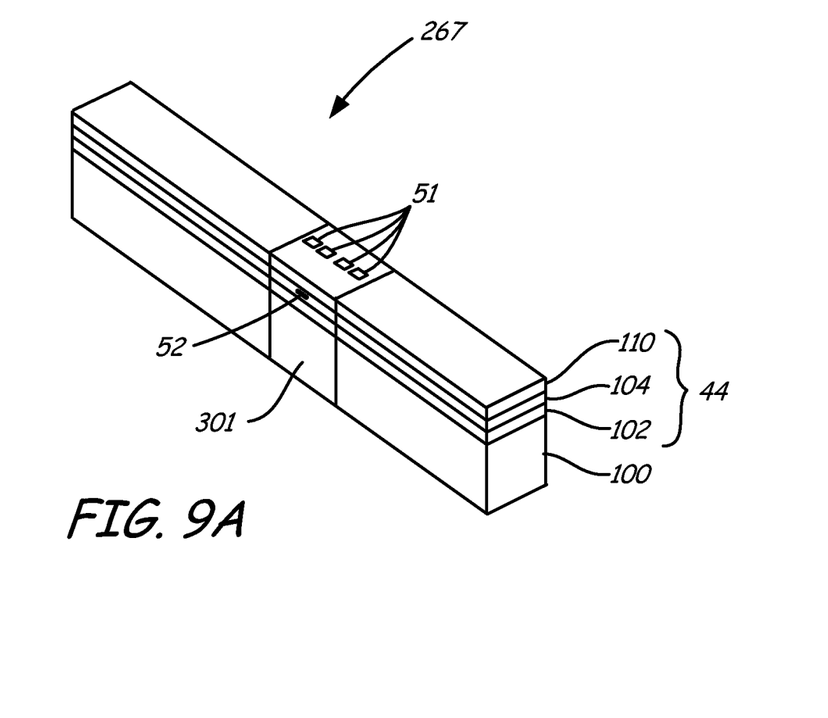
FIGS. 9A-9B show the process of cutting HAMR sliders from bars cut from HAMR slider wafers produced by wafer to wafer integration.
Figure 9B:
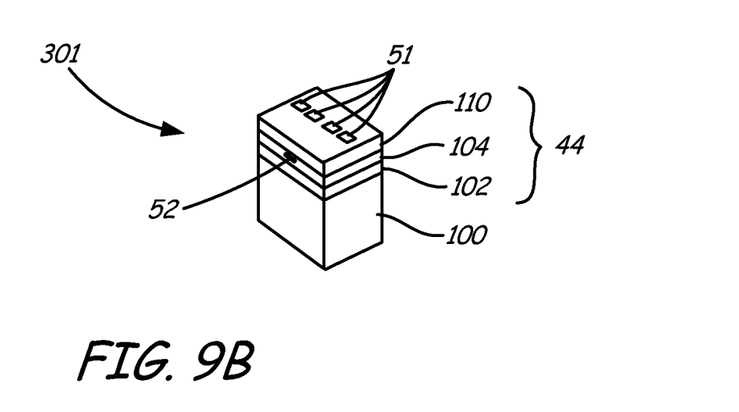

FIG. 9A shows a schematic of bar 267, for example, cut from slider wafer 270 in FIG. 8G. HAMR slider 301 cut from bar 267 in FIG. 9A is shown in FIG. 9B. Multilayer laminate 44, media facing interface 52 and electrical contacts 51 (FIG. 1) are shown on individual HAMR slider 301. The final step in fabrication of HAMR recording head slider 12 (FIG. 1) is shaping to form air bearing surfaces, etc.

Although the present invention has been described with reference to preferred embodiments, workers skilled in the art will recognize that changes may be made in form and detail without departing from the spirit and scope of the invention.

The invention claimed is:

1. A method comprising:
    producing a slider wafer populated with electrical and magnetic components;
    fabricating an array of laser chips and associated photonic components on a laser substrate wafer;
    transferring the laser chips and associated photonic components from the laser substrate wafer to the slider wafer;
    wafer bonding the laser chips to the slider wafer, wherein the laser chips are not properly aligned in a specific placement with respect to the slider wafer after the wafer bonding of the laser chips to the slider wafer; and
    after the wafer bonding of the laser chips to the slider wafer, defining the shape and optical orientation of laser chips and associated photonic components to be aligned with other magnetic and electrical components on the slider wafer, wherein defining the shape and optical orientation of laser chips and associated photonic components aligns the laser chip with respect to the slider wafer after the wafer bonding of the laser chips to the slider wafer.

2. The method of claim 1, wherein defining the shape and optical orientation comprises lithographic processing.

3. The method of claim 2, wherein the lithographic processing comprises at least one of lapping and etching.

4. The method of claim 2, wherein the lithographic processing is applied in parallel to the array of laser chips on the slider wafer.

5. The method of claim 1, wherein the laser chips are III-V or II-VI multilayer semiconductor epitaxial thin film structures.

6. The method of claim 1, wherein transferring the laser chips comprises a printing transfer process.

7. The method of claim 6, wherein the printing transfer process comprises:
    delineating laser chips on the laser substrate wafer by etching;
    contacting the laser substrate wafer with a print pad coated with a print pad adhesive;

actuating the print pad to transfer the laser chips from the laser substrate wafer to the print pad;

coating a surface of the slider wafer with a slider adhesive;

printing the laser chips on the slider wafer; and actuating the print pad to transfer the laser chips from the print pad to the slider wafer.

8. The method of claim 1, wherein wafer bonding the laser chips to the slider wafer comprises utilizing a benzocyclobutane (BCB) adhesive.

9. The method of claim 1, wherein the slider wafer comprises AlTiC.

10. The method of claim 1, wherein transferring the laser chips to the slider wafer comprises transferring the entire laser substrate wafer to the slider wafer.

11. A method comprising:

transferring an array of laser chips and associated photonic components from a laser substrate wafer to a slider wafer populated with electrical and magnetic components;

wafer bonding the laser chips to the slider wafer, wherein the laser chips are not properly aligned in a specific placement with respect to the slider wafer after the wafer bonding of the laser chips to the slider wafer; and after the wafer bonding of the laser chips to the slider wafer, aligning the laser chips and associated photonic components with other magnetic and electrical components on the slider wafer using a photolithographic process.

12. The method of claim 11, wherein photolithographic process comprises at least one of lapping and etching.

13. The method of claim 11, wherein the lithographic processing is applied in parallel to the array of laser chips on the slider wafer.

14. The method of claim 11, wherein the laser chips comprise III-V or II-VI multilayer semiconductor epitaxial thin film structures.

15. The method of claim 11, wherein transferring the laser chips comprises a printing transfer process.

16. The method of claim 15, wherein the printing transfer process comprises:

delineating laser chips on the laser substrate wafer by etching;

contacting the laser substrate wafer with a print pad coated with a print pad adhesive;

actuating the print pad to transfer the laser chips from the laser substrate wafer to the print pad;

coating a surface of the slider wafer with a slider adhesive;

printing the laser chips on the slider wafer; and actuating the print pad to transfer the laser chips from the print pad to the slider wafer.

17. The method of claim 11, wherein wafer bonding the laser chips to the slider wafer comprises utilizing a benzocyclobutane (BCB) adhesive.

18. The method of claim 11, wherein the slider wafer comprises AlTiC.

19. The method of claim 11, wherein transferring the laser chips to the slider wafer comprises transferring the entire laser substrate wafer to the slider wafer.

* * * * *